United States Patent
Seya et al.

(10) Patent No.: US 7,791,043 B2
(45) Date of Patent: Sep. 7, 2010

(54) STAGE MECHANISM, ELECTRON MICROSCOPE HAVING THE STAGE MECHANISM AND METHOD OF CONTROLLING POSITIONING OF STAGE MECHANISM

(75) Inventors: Eiichi Seya, Hitachinaka (JP); Takashi Nagamatsu, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 401 days.

(21) Appl. No.: 12/038,358

(22) Filed: Feb. 27, 2008

(65) Prior Publication Data
US 2008/0211349 A1  Sep. 4, 2008

(30) Foreign Application Priority Data
Mar. 2, 2007  (JP) .............................. 2007-053271

(51) Int. Cl.
*H01J 37/20* (2006.01)
(52) U.S. Cl. .................. 250/442.11; 310/328
(58) Field of Classification Search ............ 250/440.11, 250/442.11; 310/328
See application file for complete search history.

(56) References Cited

U.S. PATENT DOCUMENTS 5,149,967 A  9/1992  Otaka
5,483,064 A *  1/1996  Frey et al. ............... 250/442.11

FOREIGN PATENT DOCUMENTS

JP  3-129653 A  6/1991
JP  2001-196021 A  7/2001

* cited by examiner

*Primary Examiner*—Jack I Berman
(74) *Attorney, Agent, or Firm*—Crowell & Moring LLP (57) ABSTRACT

An electron microscope stage mechanism capable of performing high-accuracy positioning while limiting vibration and drift. An ultrasonic motor is used in a stage drive mechanism, and a fixing mechanism capable of increasing stop stiffness is combined integrally with the motor. That is, a structure in which a piezoelectric actuator of the fixing mechanism is mounted in a pre-load mechanism together with the ultrasonic motor is used. When the stage is fixed by the fixing mechanism after acceleration, deceleration and positioning of the stage performed by the drive mechanism, the piezoelectric actuators positioned on opposite sides of the stage are extended to press the stage.

12 Claims, 6 Drawing Sheets

STAGE MECHANISM, ELECTRON MICROSCOPE HAVING THE STAGE MECHANISM AND METHOD OF CONTROLLING POSITIONING OF STAGE MECHANISM

BACKGROUND OF THE INVENTION

1. Field of the Invention

The present invention relates to a stage mechanism for fixing a stage, an electron microscope having the stage mechanism and a method of controlling positioning of the stage mechanism.

2. Background Art

A scanning electron microscope (SEM) is an apparatus for obtaining an SEM image of a specimen by scanning a specimen surface with a probing converged electron beam and detecting backscattered electrons and secondary electrons emitted from the specimen. Such microscopes using as a probe a charged particle beam such as an electron beam have been used in various fields of research and development and have also find applications in manufacturing fields. For example, a technique to obtain an SEM image of an object to be observed (specimen) with a scanning electron microscope is applied to observation and size measurement on semiconductor fine structures and is indispensable to semiconductor manufacturing processes.

In recent years, design rules for semiconductor integrated circuits have become finer. The pattern width is, for example, 100 nm or less in quite a number of cases. Semiconductor inspection/measurement apparatuses for performing size measurement and shape observation on fine patterns, detection of foreign materials and defects, etc., include critical dimension SEMs, SEM-type defect inspection apparatuses and review SEMs.

There is a demand for obtaining images with high accuracy as well as at a high throughput for a semiconductor inspection/measurement apparatus. Therefore, high-accuracy positioning by moving at a high speed and suppression of vibration and drift at the time of stopping are required of a specimen stage on which a wafer is mounted.

Structures using a feed screw as a drive means have been used for specimen stages in many cases. In recent years, stages having an ultrasonic motor, which is a linear actuator using a piezoelectric phenomenon of a piezoelectric ceramic element as a drive source have been proposed, for example, for the purpose of improving the positioning accuracy and avoiding a chemical contamination to a wafer derived from lubricating oil. An example of such stages is a "stage for electron microscope" disclosed in JP Patent Publication (Kokai) No. 3-129653 A (1991).

As a technique to provide a fixing mechanism for the purpose of preventing a wobble or small vibration of a stage after positioning, i.e., stage drift, a "target moving device" disclosed in JP Patent Publication (Kokai) No. 2001-196021 A (particularly in paragraph [0031], FIG. 3) is known. In this example, a structure is used in which a positive voltage is applied to a piezoelectric actuator provided on a stage to cause such a deformation extending to the left and right that braking pads are displaced in such a direction as to pinch a braking rail while being fulcrumed on a boundary portion between two column portions.

SUMMARY OF THE INVENTION

Electron microscopes generally used for inspection and observation purposes in the field of manufacturing semiconductor elements are provided with specimen stages capable of supporting a wafer having a diameter of 300 mm and having a movable range larger than the diameter of the wafer for the purpose of observing the entire surface of silicon wafers without cutting the silicon wafers. However, it is difficult to sufficiently increase the mechanical stiffness of such a large specimen stage with respect to the weight. Therefore the mechanical resonance frequency is reduced, so that the stage easily picks up vibration externally applied. In general, a semiconductor manufacturing line is in a clean room environment in which the level of vibration at about 50 to 200 Hz derived from air conditioning is high. If the mechanical resonance point of the specimen stage exists in this range, the influence of the vibration is so serious that an image blur and a reduction in size measurement accuracy for example are caused.

Also, if the specimen stage has a drift (a phenomenon in which the stop position is slightly shifted with a lapse of time) at the time of observation of a specimen at a high magnification, the measurement accuracy is reduced when size measurement or the like is performed on a fine pattern.

Therefore low-vibration and low-drift characteristics are required of the specimen stage. More specifically, since the beam resolution of electronic optical systems used in semiconductor inspection/measurement electron microscope in recent years has reached to a value of about 1.5 nanometers, it is necessary to reduce the influence of disturbance such as vibration in terms of amplitude to about 1.5 nanometers or less in obtaining a good image. Also, fine pattern width measurement reproducibility of about 0.1 nanometers is required. If a stage drift of about 0.5 nanometers per second or higher exists after stage stopping, the measurement reproducibility is reduced. There is, therefore, a need to limit the drift to this or smaller value.

However, the "specimen stage for electron microscope" disclosed in JP Patent Publication (Kokai) No. 3-129653 A (1991) has problems that (1) a drift causing a slight movement of the stage after positioning stop, particularly a drift derived from residual deformation of the piezoelectric actuator specific to the ultrasonic motor, and that (2) the stage is fixed in the feed direction only by the piezoelectric actuator provided in the ultrasonic motor, the stop stiffness is low and mechanical resonance of the stage can occur easily in the region from 50 to 200 Hz.

Also, the "target moving device" disclosed in JP Patent Publication (Kokai) No. 2001-196021 A has problems that (1) the braking mechanism has the two column portions, the thin boundary portion therebetween and other portions formed by cutting out a number of grooves, is therefore low in stiffness as a whole and vibrates easily at the time of observation, and that (2) since the deformation of the piezoelectric actuator is indirectly transmitted to the brake pads through the column portion while being fulcrumed on the boundary portion, sufficient mechanical stiffness cannot be obtained, so that a drift by warping occurs easily.

In view of the above-described problems, an object of the present invention is to provide a stage mechanism capable of positioning a specimen stage with high accuracy, an electron microscope having the stage mechanism and a method of controlling positioning of the stage mechanism.

To achieve the above-described object, according to the present invention, a specimen stage is positioned by being driven with an ultrasonic motor and after being set at a desired position, the ultrasonic motor for driving the stage is separated from the stage when the stage is fixed. In this way, the influence due to a residual deformation of a piezoelectric actuator of the ultrasonic motor can be reduced to prevent a drift of the stage and to enable high-accuracy positioning of the stage.

More specifically, a stage mechanism of the present invention has a table, a stage including a base member on which the table is mounted, and a drive unit for driving the stage. The drive unit has an ultrasonic motor for driving the table, a pre-load mechanism for pressing the ultrasonic motor against the table, and fixing means for fixing the table. The fixing means is mounted on the pre-load mechanism so as to be movable integrally with the ultrasonic motor. At least a pair of the drive units are provided to form a structure in which the table is pinched between the pair of the drive units. In a case where the stage has two tables: X- and Y-tables, the four (two pairs of) drive units respectively pinch the corresponding tables by side surfaces of the tables.

The above-described fixing means is constituted by a piezoelectric actuator. The above-described pre-load mechanism has a positioning member fixed on the base member, a seat member to which the ultrasonic motor and the fixing means are attached, and an elastic member (a spring) for elastically supporting the seat member on the positioning member. The fixing means fixes the table by pressing the table and separates the ultrasonic motor from the table. For example, when a voltage is applied to the piezoelectric actuator, the piezoelectric actuator is extended to fix the table by an open end of the piezoelectric actuator not fixed on the base member, and to pressed the seat member by a fixed end of the piezoelectric actuator fixed on the seat member to separate the ultrasonic motor from the table.

Another stage mechanism according to the present invention has a stage including a table, a base member on which the stage is mounted, a drive unit for driving the stage, and fixing means for fixing the table independently of the drive unit. The drive unit has an ultrasonic motor for driving the table, a pre-load mechanism for pressing the ultrasonic motor against the table, and separating means for separating the ultrasonic motor from the table. That is, the fixing means does not act to separate the ultrasonic motor; the ultrasonic motor is separated from the table by the separating means provided independently of the fixing means. At least a pair of groups of the drive units and the fixing means are provided to form a structure in which the table is pinched between the pair of the groups of the drive units and the fixing means. In a case where the stage has two tables: X- and Y-tables, the four (two pairs of) drive units and the four fixing means respectively pinch the corresponding tables by side surfaces of the tables.

The present invention further provides an electron microscope having a stage mechanism comprising the above-described construction.

The present invention also provides a method of controlling positioning of a stage mechanism in which a control section of an electron microscope controls acceleration, deceleration and positioning of a stage performed by an ultrasonic motor, and an operation to fix the stage performed by a stage fixing mechanism using a piezoelectric actuator. At the time of positioning control, after the stage has been stopped at a positioning target position, the control section operates the stage fixing mechanism to separate the ultrasonic motor from an object to be driven. Another form of the method may be such that, after the stage has been stopped at a positioning target position, the control section operates motor separating means provided separately from the stage fixing mechanism to separate the ultrasonic motor from an object to be driven.

The other features of the present invention will become apparent from the below-described best mode for carrying out the present invention and the accompanying drawings.

The stage mechanism of the present invention enables high-accuracy positioning of a specimen stage.

BRIEF DESCRIPTION OF THE DRAWINGS

FIG. 3(*a*) is a diagram schematically showing the construction of a stage drive unit according to a first embodiment of the present invention;

FIG. 3(*b*) is a sectional view of the stage drive unit according to the first embodiment when the stage is driven;

FIG. 3(*c*) is a sectional view of the stage drive unit according to the first embodiment when the stage is fixed;

FIG. 4(*a*) is a diagram schematically showing a stage drive unit according to a second embodiment of the present invention when the stage is driven;

FIG. 4(*b*) is a diagram schematically showing the stage drive unit according to the second embodiment when the stage is fixed;

FIG. 5(*a*) is a diagram showing the flow of stage control according to the first embodiment;

FIG. 5(*b*) is a diagram showing the flow of stage control according to the second embodiment.

DETAILED DESCRIPTION OF THE PREFERRED EMBODIMENTS

Embodiments of the present invention will be described with reference to the accompanying drawings. However, it is to be noted that the embodiments described below are only example of implementation of the present invention not limiting of the present invention. Components common to the drawings are indicated by the same reference numerals.

The embodiment described below is an example of application of the present invention to a scanning electron microscope (critical dimension SEM) with which the size of a fine pattern formed on a wafer (specimen) surface. Needless to say, the stage device according to the present invention can be applied to charged particle beam apparatuses in general, having a stage device moving two-dimensionally in X- and Y-directions while clutching a holder holding a specimen, e.g., electron beam drawing apparatuses and focused ion beam (FIB) apparatuses as well as to SEMs, and to optical inspection apparatuses or the like for performing inspection as to foreign materials and defects by using light scattering or the like as well as to charged particle beam apparatuses. The specimen held on the holder is not limited to wafers.

Figure 1:
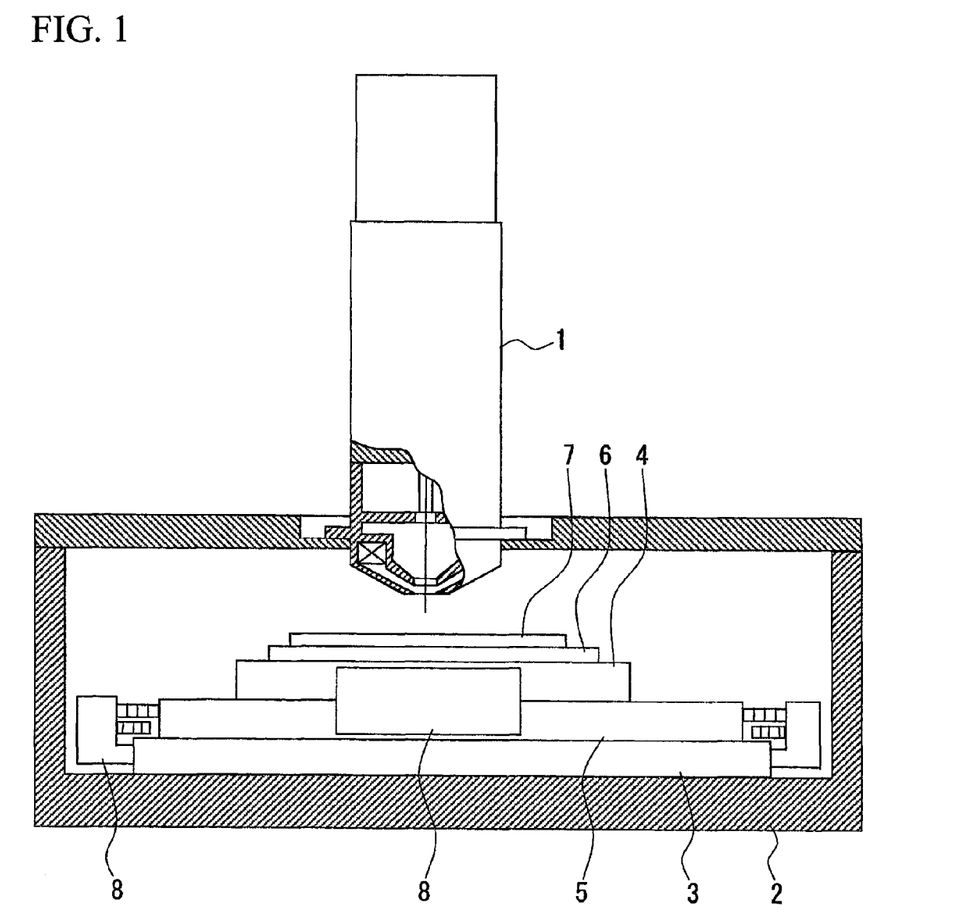
FIG. 1 is a diagram schematically showing the construction of an electron microscope apparatus according to one embodiment of the present invention.

FIG. 1 is a diagram schematically showing the construction of a critical dimension SEM. The critical dimension SEM according to the present invention has a charged particle optical system 1 and a specimen chamber 2 in which a stage described below is housed and a wafer (specimen) 7 is moved to an arbitrary inspection position. In the critical dimension SEM, a charged particle beam emitted from a charged particle beam source is converged into a thin beam on the wafer 7; the wafer 7 is scanned with this beam; secondary electrons or the like emitted from the wafer 7 are detected to obtain a scanned image of the wafer 7; and the size of a fine pattern of a 30 nm width at the minimum formed on the wafer from a signal representing the scanned image.

The specimen chamber 2 is used in a vacuum state at about $10^{-4}$ pascal by a vacuum pump (not shown in FIG. 1) or the like. The stage placed in the specimen chamber 2 is a mechanism in which any point on the wafer is moved and positioned to a critical dimension measuring position to which the electron beam is irradiated. The stage has a base 3, an X-table 4, a Y-table 5 and a chuck mechanism 6. The X-table 4 and the Y-table 5 are provided on the base 3. The stage moves two-dimensionally in the X- and Y-directions. A chuck mechanism 6 is provided on the X-table 4. The wafer 7 is fixed by the chuck mechanism 6.

The above-described construction is common to first and second embodiments described below. Stage mechanisms according to the first and second embodiments will be described below in detail.

First Embodiment

Figure 2:
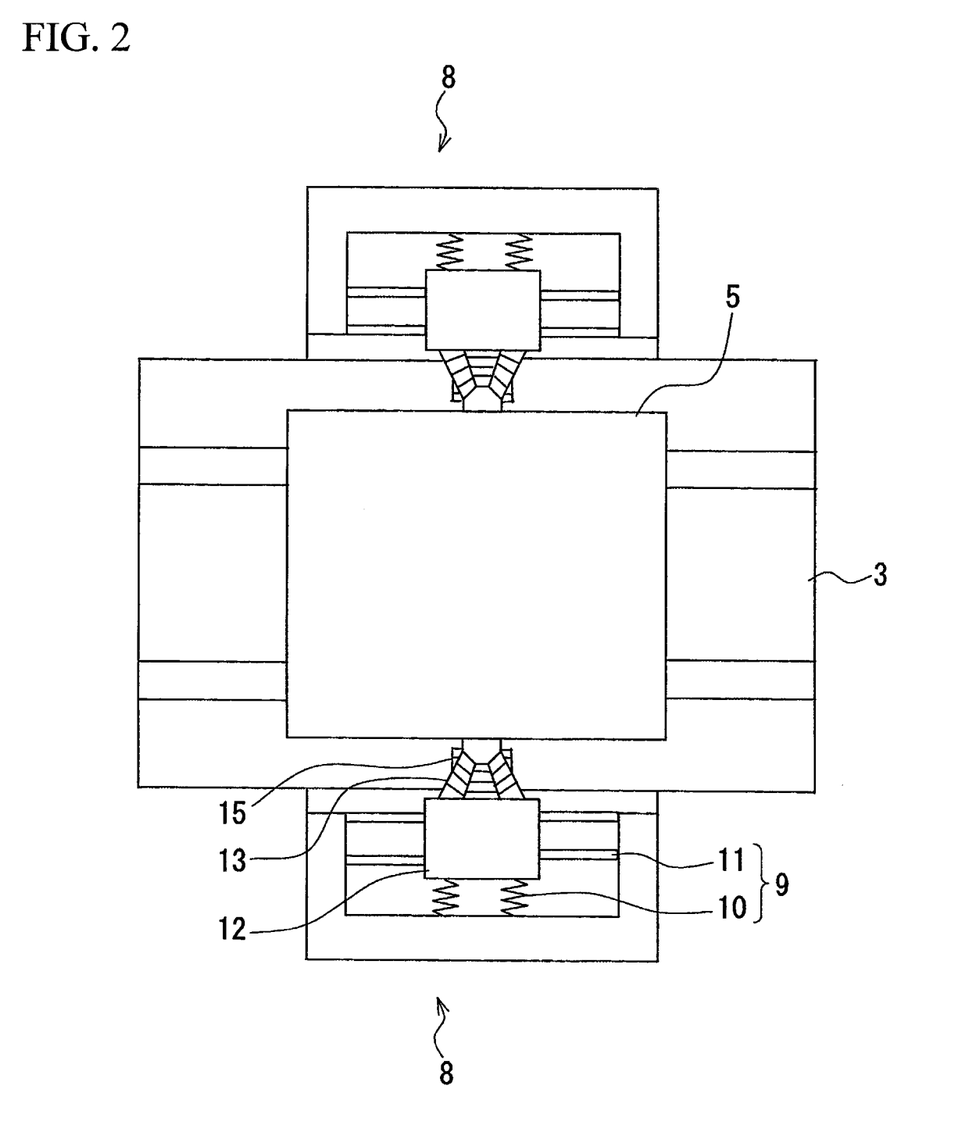
FIG. 2 is a diagram schematically showing the construction of a stage in the electron microscope apparatus in one embodiment of the present invention.

FIG. 2 is a diagram showing the basic construction of the stage mechanism according to the first embodiment of the present invention. The stage is constituted by the Y-table 5 capable of moving in the Y-direction in the specimen chamber 2, and the X-table 4 capable of moving in the X-direction above the base 3. Only the Y-table 5 is shown in FIG. 2. Stage drive units 8 each having both a drive mechanism for accelerating/decelerating and positioning and a fixing mechanism for fixing the stage moves the X-table 4 and the Y-table 5 to accelerate, decelerate, position, stop and fix the stage. The stage drive units 8 are placed so as to pinch the stage to enable execution of acceleration/deceleration, positioning and fixing of the stage with stability.

In general, in a stage drive mechanisms using an ultrasonic motor, a pre-load mechanism 9 for resiliently pressing the ultrasonic motor against a movable portion is used for the reason described below. That is, while the stroke of expansion/contraction of the piezoelectric actuator is small, several microns or less, there is a limit to the machining accuracy of the stage mechanism. Due to an error in the machining accuracy, there is a possibility of the ultrasonic motor differently contacting the movable portion of the stage drive unit 8 with respect to the same movement stroke.

The pre-load mechanism 9 in the present embodiment is constituted by a combination of two types of springs: plate springs 11 and coil springs 10 which support and press a base member 12 on which the stage drive unit 8 is mounted. The coil springs 10 produce a pressing force. The plate springs 11 limit changes in attitude of the stage drive unit 8 in the rotating and other directions, and limit a displacement in the feed direction. The stage drive unit 8 is pressed against the stage with stability by the pressing force of the plate springs 11 and is supported highly stiffly in the feed direction by the plate springs 11.

Figure 3A:
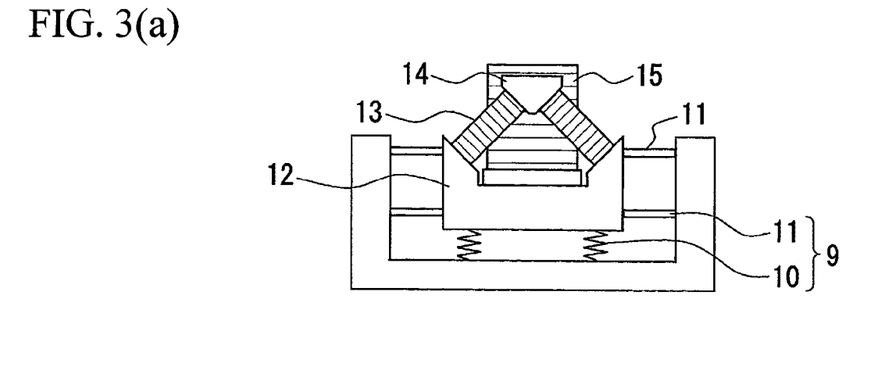

FIG. 3(a) is a diagram showing the basic construction of the stage drive unit 8 according to the first embodiment. As shown in FIG. 3(a), the stage drive unit 8 has the pre-load mechanism 9 (coil springs 10 and plate springs 11), the base member 12, an ultrasonic motor 13 provided as a drive mechanism, and a piezoelectric brake 15 provided as a fixing mechanism. FIG. 3(a) illustrates a state where the piezoelectric brake 15 is displaced forward relative to a drive chip 14 attached to the fore end of the ultrasonic motor, i.e., a state when the stage is fixed (braked state). Also, FIG. 3(a) shows a configuration as seen from above in FIG. 3(c) described later.

The ultrasonic motor 13 has a pair of piezoelectric actuators fixed, with a predetermined angle set therebetween. Fore ends of the piezoelectric actuators are fixed to the common drive chip 14. When voltages in phase opposition to each other are applied to the pair of piezoelectric actuators, a displacement of the drive chip 14 in the stage feed direction is caused by a circular motion. By application of voltages in phase with each other, a displacement in the pressing direction perpendicular to the feed direction. By using these displacement, the ultrasonic motor 13 can be used as an ultrasonic linear actuator.

The piezoelectric brake 15 is provided on the base member 12 in parallel with the ultrasonic motor 13. The piezoelectric brake 15 is placed so that the center of the movement stroke of its fore end generally coincides with the fore end position of the drive chip 14 while the stage is driven. This placement enables the fore end of the piezoelectric brake 15 to be moved either forward or backward relative to the fore end of the drive chip 14.

Figure 3B:
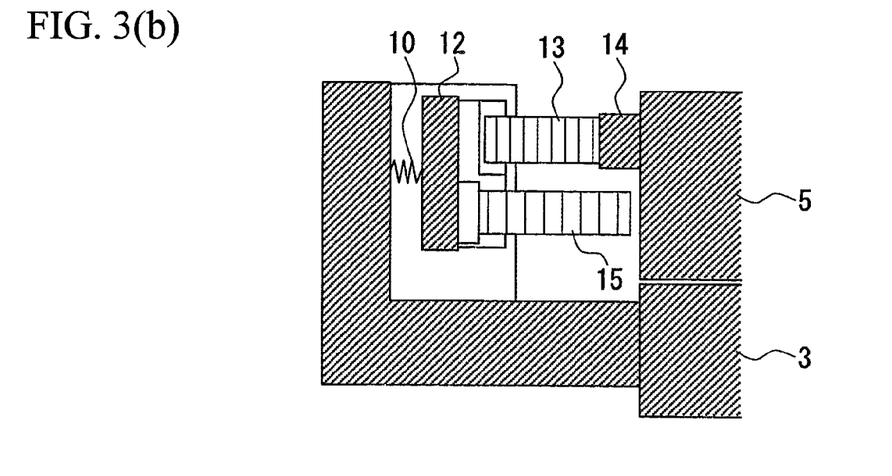
Figure 3C:
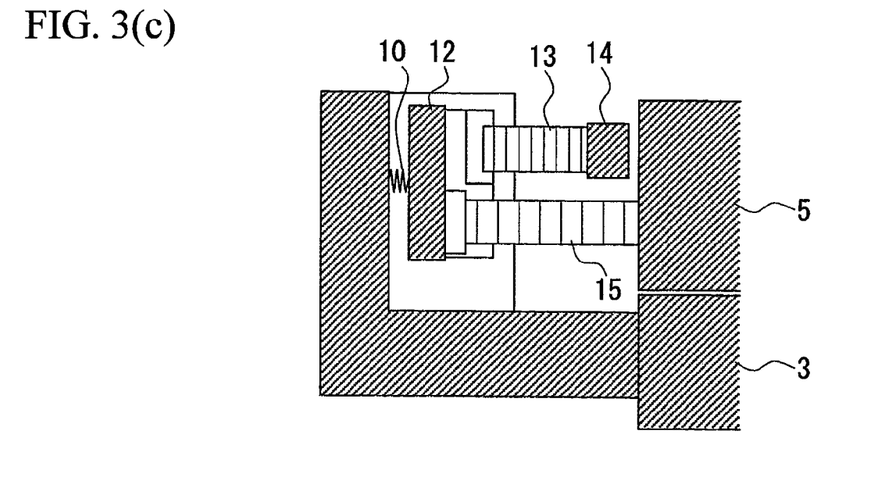

FIGS. 3(b) and 3(c) show comparison between the state of the stage drive unit 8 when the stage is driven and the state of the stage drive unit 8 when the stage is fixed. When the stage is driven in the state shown in FIG. 3(b), the piezoelectric brake 15 is in a contracted state, and only the ultrasonic motor 13 contacts the table to perform driving.

When the stage is fixed in the state shown in FIG. 3(c), the piezoelectric brake 15 is extended to cause the fore end to protrude beyond the fore end of the ultrasonic motor 13. That is, the piezoelectric brake 15 is extended to brought into abutment against the table 5 and is further extended to press the table 5. The drive chip 14 is then separated from the table. When the table 5 is further pressed, a rear end portion of the piezoelectric brake 15 presses the base member 12 backward. Since the pre-load mechanism 9 is elastically deformable in the pressing direction, a pressure higher than the pressure necessary for fixing the table 5 is absorbed by the pre-load mechanism 9. As a result, only the fore end of the piezoelectric brake 15 contacts the table 5. Thus, the drive chip 14 of the ultrasonic motor is separated from the table by the piezoelectric brake 15 and a surplus pressure applied to the table 5 is released by the pre-load mechanism 9. Therefore, the stage can be fixed without causing a drift and can be positioned with high accuracy.

Figure 5A:
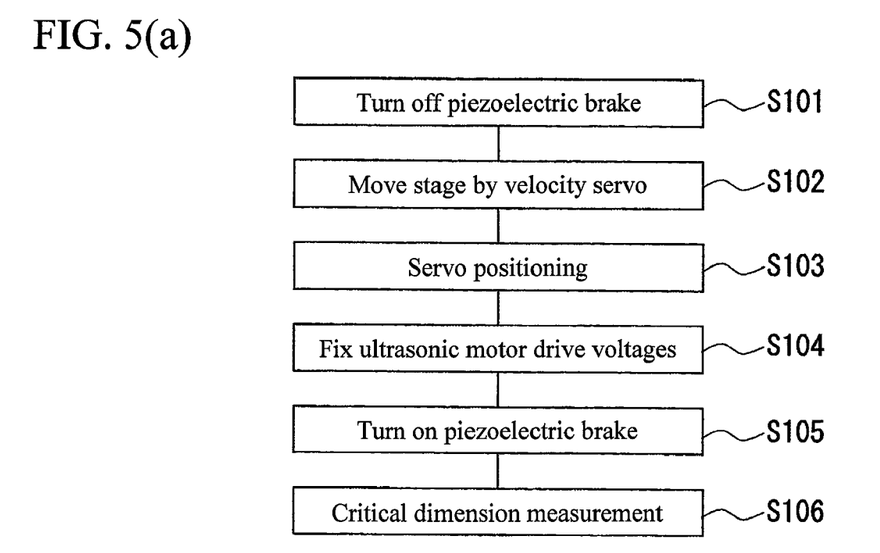

The operation of the present embodiment when executed by means of a software program will be described. FIG. 5(a) is a flowchart for explaining the stage control operation according to the first embodiment. Each step in the flowchart is executed by a control system (including a CPU) (not shown) unless otherwise specified.

In step S101, after the completion of the preceding critical dimension measurement, the voltage applied to the piezoelectric brake 15 provided as a fixing mechanism is turned off to undo fixing of the stage. Subsequently, in step S102, voltage is applied to the ultrasonic motor 13 and the stage is accelerated/decelerated by the ultrasonic motor 13, thereby positioning the stage at the next critical dimension measuring position. After the completion of stage positioning in step S103, the drive voltage to the ultrasonic motor 13 is fixed in step S104. Subsequently, in step S105, the voltage is applied to the piezoelectric brake 15 provided as a fixing mechanism. The piezoelectric actuator of the piezoelectric brake 15 is thereby extended to fix the table and to separate the fore end of the ultrasonic motor 13 from the drive surface. In step S106, critical dimension measurement is executed without being influenced by any drift and vibration, by virtue of fixing of the table. At this time, there is no need for waiting for convergence of residual deformation of the piezoelectric actuator.

The critical dimension throughput can therefore be improved. After the stage has been fixed, the ultrasonic motor 13 does not contact the table upto the next activation of the stage. Therefore, the drive voltage during the time period upto the next activation of the stage may be set to any value.

Second Embodiment

Figure 4A:
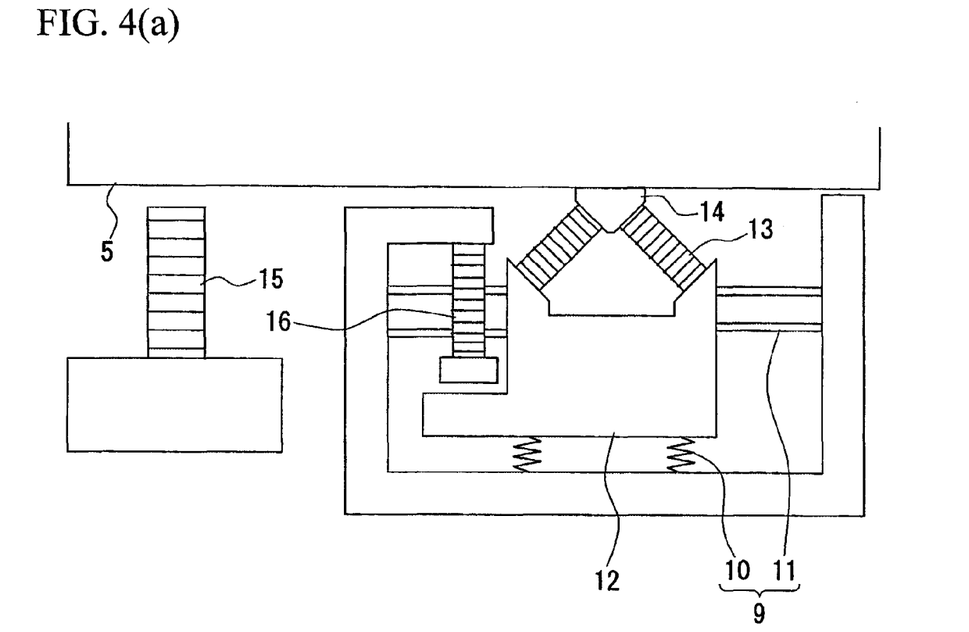
Figure 4B:
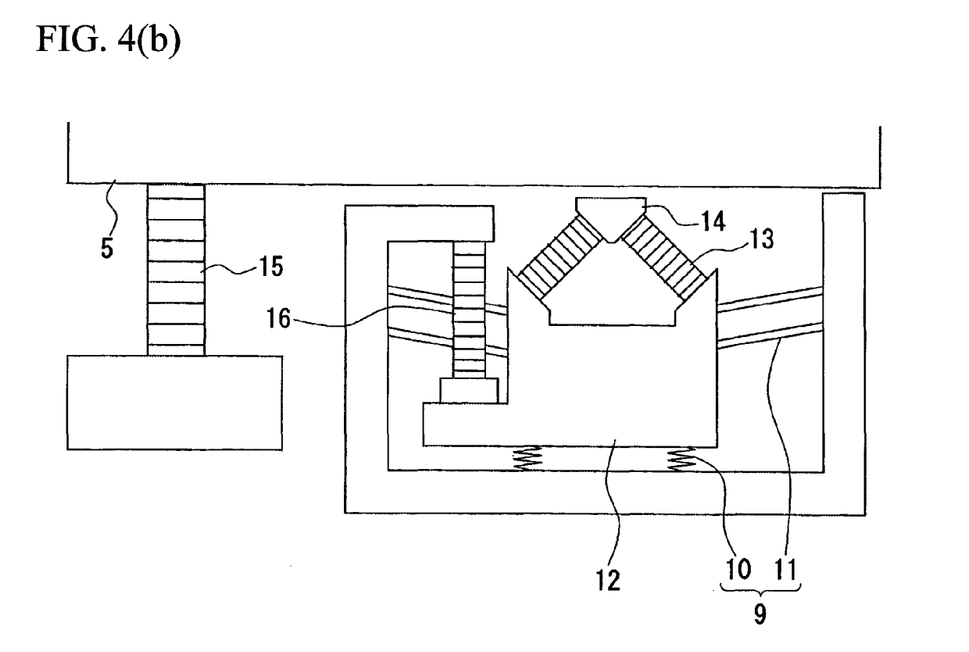

In the construction of the stage mechanism according to the second embodiment, in contrast to the first embodiment, the piezoelectric brake 15 is not provided integrally with the base member 12. Instead, a different mechanism for separating the ultrasonic motor from the drive surface is provided.

FIGS. 4(*a*) and 4(*b*) shows structures in which the piezoelectric brake 15 provided as a fixing mechanism is placed separately from the pre-load mechanism 9 provided with the ultrasonic motor 13. As shown in FIGS. 4(*a*) and 4(*b*), a separating mechanism 16 for separating the ultrasonic motor 15 from the stage is additionally provided in the pre-load mechanism 9. A piezoelectric actuator is used in the separating mechanism 16. However, a separating mechanism using any other mechanical construction may alternatively be used.

When the stage is driven in the state shown in FIG. 4(*a*), the piezoelectric brake 15 provided as a fixing mechanism and the separating mechanism 16 are in a retracted state, and only the ultrasonic motor 13 contacts the table to perform driving.

When the stage is fixed in the state shown in FIG. 4(*b*), the piezoelectric brake 15 provided as a fixing mechanism is extended to be brought into contact with the table, thereby fixing the stage. Simultaneously, a voltage is applied to the separating mechanism 16 to move the base member 12 backward. The ultrasonic motor 13 is thereby mechanically separated from the drive surface, so that the ultrasonic motor 13 is not pressed against the drive surface by the action of the pre-load mechanism 9.

Figure 5B:
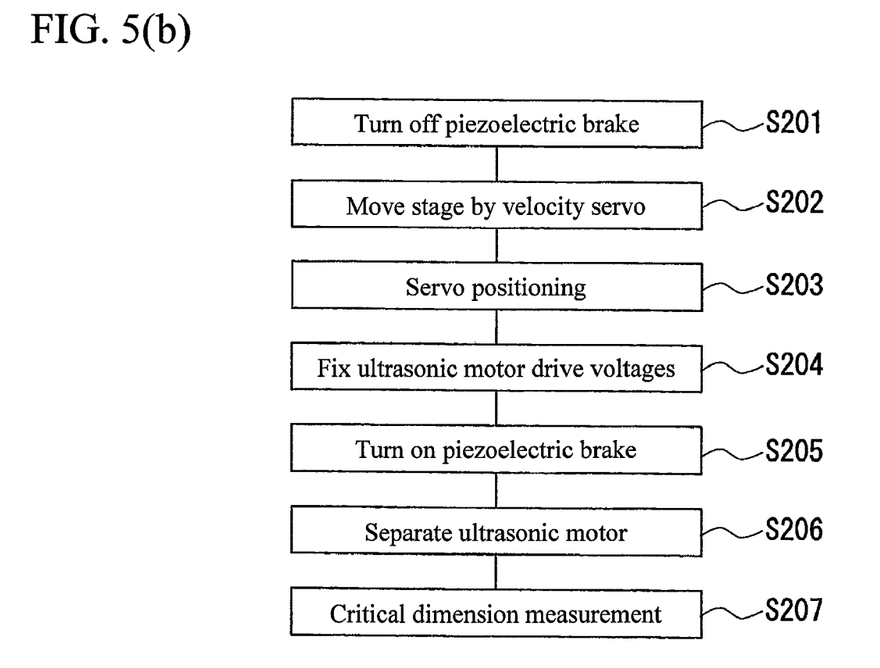

The operation of the present embodiment when executed by means of a software program will be described. FIG. 5(*b*) is a flowchart for explaining the stage control operation according to the second embodiment. Each step in the flowchart is executed by a control system (including a CPU) unless otherwise specified.

In step S201, after the completion of the preceding critical dimension measurement, the voltage applied to the piezoelectric brake 15 provided as a fixing mechanism is turned off to undo fixing of the stage. Subsequently, in step S202, voltage is applied to the ultrasonic motor 13 and the stage is accelerated/decelerated by the ultrasonic motor 13, thereby positioning the stage at the next critical dimension measuring position. After the completion of stage positioning in step S203, the drive voltage to the ultrasonic motor 13 is fixed in step S204. Subsequently, in step S205, the voltage is applied to the piezoelectric brake 15 provided as a fixing mechanism. The piezoelectric actuator of the piezoelectric brake 15 is thereby extended to fix the table. In step S206, the separating mechanism 16 is operated to separate the fore end of the ultrasonic motor 13 from the drive surface. It is necessary to execute this separating operation immediately after fixing the ultrasonic motor drive voltages in order to avoid a change of the table positioning position due to a drift of the ultrasonic motor 13. In step S207, critical dimension measurement is executed without being influenced by any drift and vibration, by virtue of fixing of the table. At this time, there is no need for waiting for convergence of residual deformation of the piezoelectric actuator. The critical dimension throughput can therefore be improved. After the stage has been fixed, the ultrasonic motor 13 does not contact the table upto the next activation of the stage. Therefore, the drive voltage during the time period upto the next activation of the stage may be set to any value.

<Consideration of Influence of Residual Deformation of Piezoelectric Actuator>

In use in ordinary table positioning or the like, the ultrasonic motor is considered to have, because of its solid contact structure, the advantage of being used as a fixing mechanism after the completion of positioning without being changed. Therefore, a method of use such that the motor is separated after positioning is not adopted.

However, in the field where a drift on the nanometer order is critical as in measurement of an extremely fine semiconductor pattern, residual deformation characteristics of photoelectric actuator raises a problem.

Figure 6:
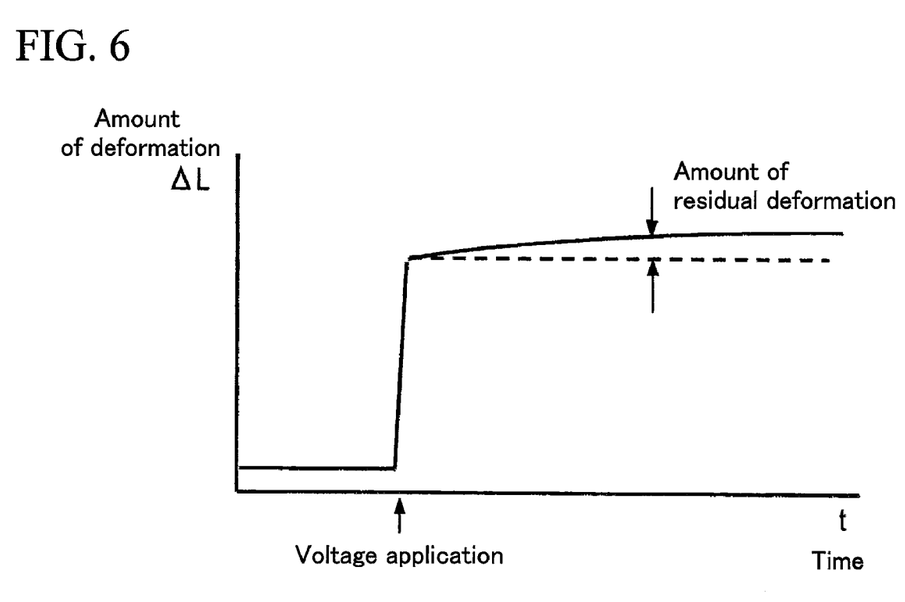
FIG. 6 is a graph showing an example of the relationship of the amount of extension of a piezoelectric actuator with respect to elapsed time.

FIG. 6 is a diagram showing ordinary characteristics of the piezoelectric actuator used in the ultrasonic motor 13 and the piezoelectric brake 15 provided also in the present invention. The abscissa represents elapsed time t, and the ordinate represents the amount of deformation $\Delta L$ of the piezoelectric actuator.

As can be understood from FIG. 6, the piezoelectric actuator has such a characteristic as to extend/contract by application/removal of a voltage. The piezoelectric actuator has an extremely high response speed and deforms instantaneously when a voltage is applied. However, as is widely known, a residual deformation of the piezoelectric actuator is caused with a lapse of time thereafter, although the amount of the residual deformation is small.

Also, since the ultrasonic motor 13 has the piezoelectric actuator placed so as to form an angle not equal to 90 degrees with respect to the pressing direction, the above-described residual deformation can be a cause of a drift in the stage drive direction.

A residual deformation derived from the photoelectric element is also caused in the piezoelectric brake 15. However, the direction of the residual deformation is perpendicular to the stage drive direction, so that the residual deformation causes only a change in the pressing force and is absorbed by the pre-load mechanism 9. Therefore the residual deformation does not influence a drift in the stage drive direction.

Thus, according to the present invention, a stage mechanism not influenced by any drift derived from a piezoelectric actuator residual deformation can be implemented.

The sectional area of the piezoelectric actuators used for the ultrasonic motor 13 cannot be increased because the piezoelectric is required to response at high speed. However, the piezoelectric actuator used in the piezoelectric brake 15 may only have a response speed of about 100 milliseconds and the element having an increased sectional area can be used. Consequently, in comparison with a case where the ultrasonic motor 13 is singly used, the stop stiffness can be increased to improve the vibration characteristics of the stage. In actual use of the present invention, the piezoelectric brake 15 was used to enable the stage to have an increased mechanical resonance point in the feed direction upto 250 Hz in contrast to a corresponding mechanical resonance point of 70 Hz in a case where only the ultrasonic motor 13 was used. Also, the stage drift can be limited to 0.5 nanometers/second after a lapse of 1 second from a stop of the stage.

While each of the embodiments has the construction in which the tables are driven by the stage drive units 8 provided on the non-moving base side, a different stage construction may alternatively be adopted in which similar drive units are provided on the moving table side to apply a drive force between the table and the base or fix the table. Also with this arrangement, the same effects as described above can be expected and a high-performance electron microscope can be implemented.

CONCLUSION

The present invention can be used as a stage mechanism for fixing a stage in an ordinary electron microscope. However, because of enabling high-accuracy positioning, the present invention is suitable for use in a specimen stage mechanism particularly used in an electron microscope for inspection and measurement in the field of semiconductor device manufacture.

In the stage mechanism and the electron microscope according to the present invention, an ultrasonic motor and a fixing mechanism capable of increasing stop stiffness are combined integrally with each other in a mechanism for driving a stage. That is, a structure in which an ultrasonic motor and a piezoelectric actuator of a fixing mechanism are mounted together in a pre-load mechanism for pressing the ultrasonic motor against a member to be driven is used; the piezoelectric actuator in the fixing mechanism is extended to press the stage when the stage is fixed by the fixing mechanism after acceleration/deceleration and positioning of the stage by the drive mechanism; and, simultaneously with this pressing, the ultrasonic motor is separated from the table (the member to be driven) of the stage. In this way, the member to be driven is prevented from being influenced by a residual deformation of the piezoelectric actuators constituting the ultrasonic motor, thus preventing transmission of a drift to the member to be driven.

Consequently, a stage mechanism and an electron microscope capable of limiting noise due to a drift or vibration when the stage is stopped and having high positioning accuracy can be provided. Also, a reduction in the time during which settlement of the stage is waited for can be achieved by limiting a drift specific to the ultrasonic motor, so that the throughput of the electron microscope can be improved.

Positioning and stopping of the stage as well as acceleration and deceleration can be performed only by the ultrasonic motor. However, with fixing of the stage by the ultrasonic motor only, problems arise such that (1) a drift specific to the ultrasonic motor occurs in the stage drive dire direction due to the above-described piezoelectric actuator residual deformation problem, (2) sufficient fixing stiffness cannot be obtained, and the like. If the arrangement according to the present embodiments is adopted, these problems can be solved.

Apart from the present invention, a method of applying a piezoelectric actuator or the like separately from the ultrasonic motor is conceivable as an ordinary fixing method. However, it is necessary to elastically pressing the ultrasonic motor against the drive surface by using a pre-load mechanism in order to uniformize surface contact through the feed stroke. Therefore, even when the drive chip is retracted by deforming the ultrasonic motor itself by the drive voltage, the ultrasonic motor cannot be separated from the drive surface because it is pressed against the surface by the action of the pre-load mechanism. As a result, both the ultrasonic motor and the piezoelectric brake simultaneously act on the stage after positioning, and there is a possibility of a force derived from a residual deformation specific to the ultrasonic motor being applied in the stage drive direction against fixing with the piezoelectric brake 15 to cause fine vibration of the stage. Also, by the action of the forces contrary to each other, a slip is caused between the drive chip and the table. Under such a condition, considerable generation of dust, wear and surface roughening occur easily.

In the first embodiment of the present invention, the ultrasonic motor and the fixing mechanism are provided in parallel with each other on the pre-load mechanism to enable the ultrasonic motor to be separated from the drive surface when the fixing mechanism operates. Therefore, no such problems as those described above occur. Also, in the second embodiment of the present invention, a mechanism for separating the ultrasonic motor is provided separately from the fixing mechanism to be able to avoid the above-described problems.

What is claimed is:

1. A stage mechanism comprising a stage including a table, a base member on which the table is mounted, and a drive unit for driving the stage,
    wherein the drive unit has an ultrasonic motor for driving the table, a pre-load mechanism for pressing the ultrasonic motor against the table, and fixing means for fixing the table, and
    wherein the fixing means is mounted on the pre-load mechanism so as to be movable integrally with the ultrasonic motor.

2. The stage mechanism according to claim 1, wherein at least a pair of the drive units are provided to form a structure in which the table is pinched between the pair of the drive units.

3. The stage mechanism according to claim 1, wherein the fixing means is constituted by a piezoelectric actuator;
    the pre-load mechanism has a positioning member fixed on the base member, a seat member to which the ultrasonic motor and the fixing means are attached, and an elastic member for elastically supporting the seat member on the positioning member; and
    the fixing means fixes the table by pressing the table and separates the ultrasonic motor from the table.

4. The stage mechanism according to claim 3, wherein the fixing means fixes the table by its open end of the piezoelectric actuator not fixed on the seat member, and presses the seat member by its fixed end fixed on the seat member to separate the ultrasonic motor from the table.

5. A stage mechanism comprising a stage including a table, a base member on which the table is mounted, a drive unit for driving the stage, and fixing means for fixing the table,
    wherein the drive unit has an ultrasonic motor for driving the table, a pre-load mechanism for pressing the ultrasonic motor against the table, and separating means for separating the ultrasonic motor from the table.

6. The stage mechanism according to claim 5, wherein at least a pair of groups of the drive units and the fixing means each of which groups are provided to form a structure in which the table is pinched between the pair of the groups of the drive units and the fixing means.

7. The stage mechanism according to claim 5, wherein the fixing means is constituted by a piezoelectric actuator and fixed on the base member;
    the pre-load mechanism has a positioning member which is fixed on the base member, and to which the separating means is attached, a seat member to which the ultrasonic motor is attached, and an elastic member for elastically supporting the seat member on the positioning member;
    the fixing means fixes the table by pressing the table; and
    the separating means separates the ultrasonic motor from the table after the action of the fixing means on the table.

8. The stage mechanism according to claim 5, wherein the separating means is constituted by a piezoelectric actuator.

9. The stage mechanism according to claim 1, wherein the stage has an X-table capable of moving in the X-direction on a two-dimensional plane and a Y-table capable of moving in the Y-direction, and a plurality of the drive units are provided to enable two-dimensional movement of the stage in such a manner that at least one of the drive units drives the X-table, and at least one of the drive units drives the Y-table.

10. An electron microscope comprising the stage mechanism according to claim 1.

11. A method of controlling positioning of a stage mechanism in which a control section controls acceleration, deceleration and positioning of a stage performed by an ultrasonic motor, and an operation to fix the stage performed by a stage fixing mechanism using a piezoelectric actuator, the method comprising:

operating the control section so that after the stage has been stopped at a positioning target position, the stage fixing mechanism is operated to separate the ultrasonic motor from an object to be driven.

12. A method of controlling positioning of a stage mechanism in which a control section controls acceleration, deceleration and positioning of a stage performed by an ultrasonic motor, and an operation to fix the stage performed by a stage fixing mechanism using a piezoelectric actuator, the method comprising:

operating the control section so that after the stage has been stopped at a positioning target position, motor separating means provided separately from the stage fixing mechanism is operated to separate the ultrasonic motor from an object to be driven.

* * * * *